(12) United States Patent
Hwang et al.

(10) Patent No.: US 11,683,949 B2
(45) Date of Patent: Jun. 20, 2023

(54) FLEXIBLE COVER WINDOW AND FOLDABLE DISPLAY APPARATUS

(71) Applicant: Samsung Display Co., Ltd., Yongin-si (KR)

(72) Inventors: Seongjin Hwang, Yongin-si (KR); Minsang Koo, Yongin-si (KR); Kyungman Kim, Yongin-si (KR); Sanghoon Kim, Yongin-si (KR); Minhoon Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 218 days.

(21) Appl. No.: 17/109,797

(22) Filed: Dec. 2, 2020

(65) Prior Publication Data

US 2021/0367189 A1 Nov. 25, 2021

(30) Foreign Application Priority Data

May 21, 2020 (KR) .................. 10-2020-0060897

(51) Int. Cl.
| | | |
|---|---|---|
| *H10K 50/84* | (2023.01) | |
| *H10K 102/00* | (2023.01) | |
| *H10K 59/12* | (2023.01) | |
| *H01L 51/52* | (2006.01) | |
| *H01L 27/32* | (2006.01) | |

(52) U.S. Cl.
CPC ...... *H01L 51/5237* (2013.01); *H01L 27/3244* (2013.01); *H01L 2251/5338* (2013.01)

(58) Field of Classification Search
CPC .................................. H01L 51/5237

USPC ........................................................ 361/679
See application file for complete search history.

(56) References Cited

U.S. PATENT DOCUMENTS

| | | | |
|---|---|---|---|
| 8,416,514 B2 * | 4/2013 | Kim ................ | B29D 11/00307 |
| | | | 359/811 |
| 10,299,390 B2 | 5/2019 | Ki et al. | |
| 2018/0197933 A1 * | 7/2018 | Son ...................... | H01L 27/323 |
| 2019/0025886 A1 | 1/2019 | Ryu et al. | |
| 2019/0173030 A1 | 6/2019 | Kim et al. | |
| 2019/0198802 A1 * | 6/2019 | Lee ...................... | H01L 27/3262 |
| 2020/0136069 A1 * | 4/2020 | Paek ....................... | C03C 15/00 |
| 2020/0209925 A1 * | 7/2020 | Paek ....................... | G09F 9/301 |
| 2021/0367172 A1 * | 11/2021 | Kawanago ............. | H05B 33/02 |

FOREIGN PATENT DOCUMENTS

| | | |
|---|---|---|
| KR | 10-2013-0061812 | 6/2013 |
| KR | 10-1484452 | 2/2015 |
| KR | 10-2015-0051459 | 5/2015 |
| KR | 10-2016-0117799 | 10/2016 |

(Continued)

*Primary Examiner* — Prabodh M Dharia
(74) *Attorney, Agent, or Firm* — Kile Park Reed & Houtteman PLLC

(57) ABSTRACT

A flexible cover window includes a lower glass substrate including a first lower glass substrate; a second lower glass substrate, the first lower glass substrate and the second lower glass substrate being spaced apart from each other; an upper glass substrate that is disposed above the lower glass substrate and is thinner than the lower glass substrate; and an adhesive member disposed between the lower glass substrate and the upper glass substrate and extending between the first lower glass substrate and the second lower glass substrate.

20 Claims, 13 Drawing Sheets

(56) References Cited

FOREIGN PATENT DOCUMENTS

| | | |
|---|---|---|
| KR | 10-2017-0080446 | 7/2017 |
| KR | 10-2019-0066106 | 6/2019 |
| KR | 10-2068729 | 1/2020 |
| KR | 10-2069040 | 1/2020 |

* cited by examiner

FLEXIBLE COVER WINDOW AND FOLDABLE DISPLAY APPARATUS

CROSS-REFERENCE TO RELATED APPLICATION(S)

This application claims priority to and the benefit of Korean Patent Application No. 10-2020-0060897 under 35 U.S.C. § 119, filed in the Korean Intellectual Property Office on May 21, 2020, the entire contents of which are incorporated herein by reference.

BACKGROUND

1. Technical Field

The present disclosure relates to a flexible cover window and a foldable display apparatus.

2. Description of Related Art

Mobile electronic devices are widely used. Tablet PCs have been widely used as mobile electronic devices in recent years in addition to small electronic devices such as mobile phones.

Such mobile electronic devices include a display apparatus to provide a user with various functions, for example, visual information such as images or pictures. Recently, as other components for driving a display apparatus have been miniaturized, a proportion of the display apparatus in an electronic device is gradually increasing, and development of a display apparatus that may be variously transformed, for example, that may be bent or folded, is ongoing.

A foldable display apparatus among display apparatuses may include a display panel and a flexible cover window for protecting the display panel, and the display panel and the flexible cover window may be folded.

SUMMARY

One or more embodiments include a flexible cover window having improved durability and a foldable display apparatus.

Additional aspects will be set forth in part in the description which follows and, in part, will be apparent from the description, or may be learned by practice of the presented embodiments of the disclosure.

According to an embodiment, a flexible cover window may include a lower glass substrate including a first lower glass substrate; and a second lower glass substrate, the first lower glass substrate and the second lower glass substrate being spaced apart from each other; an upper glass substrate that is disposed above the lower glass substrate and is thinner than the lower glass substrate; and an adhesive member disposed between the lower glass substrate and the upper glass substrate and extending between the first lower glass substrate and the second lower glass substrate.

In an embodiment, the adhesive member may connect the first lower glass substrate, the second lower glass substrate, and the upper glass substrate to one another.

In an embodiment, the flexible cover window may include a bending area; a first extension area; and a second extension area, the first extension area and the second extension area being respectively connected to corresponding sides of the bending area. The first lower glass substrate may be located in the first extension area, and the second lower glass substrate may be located in the second extension area.

In an embodiment, the upper glass substrate may include a lower surface facing the lower glass substrate; and a side surface intersecting the lower surface, and the adhesive member may extend from the lower surface of the upper glass substrate to cover the side surface of the upper glass substrate.

In an embodiment, an end portion of the first lower glass substrate and an end portion of the second lower glass substrate, which face each other, may each include at least two step shapes.

In an embodiment, the first lower glass substrate may include a plurality of first protrusion portions protruding toward the second lower glass substrate, and the second lower glass substrate may include a plurality of second protrusion portions protruding toward the first lower glass substrate.

In an embodiment, each of the plurality of first protrusion portions may face corresponding one of the plurality of second protrusion portions.

In an embodiment, the first lower glass substrate may comprise a plurality of recesses, each of the plurality of recesses is disposed between two adjacent first protrusion portions of the plurality of first protrusion portions, and each of the plurality of second protrusion portions may face corresponding one of the plurality of recesses.

In an embodiment, a refractive index of the adhesive member may be identical to a refractive index of at least one of the lower glass substrate and the upper glass substrate.

In an embodiment, at least one of the lower glass substrate and the upper glass substrate may be an ultra-thin tempered glass.

According to another embodiment, a foldable display apparatus may include a display panel including a display area; and a flexible cover window covering the display panel. The flexible cover window may include a lower glass substrate including a first lower glass substrate; and a second lower glass substrate, the first lower glass substrate and the second lower glass substrate being spaced apart from each other; an upper glass substrate that is disposed above the lower glass substrate and is thinner than the lower glass substrate; and an adhesive member disposed between the lower glass substrate and the upper glass substrate and extending between the first lower glass substrate of the lower glass substrate and the second lower glass substrate of the lower glass substrate, and the foldable display apparatus is folded with respect to a folding axis intersecting the display area.

In an embodiment, the adhesive member may connect the first lower glass substrate, the second lower glass substrate, and the upper glass substrate to one another.

In an embodiment, the flexible cover window may include a bending area corresponding to the folding axis; a first extension area; and a second extension area, the first extension area and the second extension area being respectively connected to corresponding sides of the bending area, the first lower glass substrate may be located in the first extension area, and the second lower glass substrate may be located in the second extension area.

In an embodiment, the upper glass substrate may include a lower surface facing the lower glass substrate; and a side surface intersecting the lower surface. The adhesive member may extend from the lower surface of the upper glass substrate to cover the side surface of the upper glass substrate.

In an embodiment, an end portion of the first lower glass substrate and an end portion of the second lower glass substrate, which face each other, may each include at least two step shapes.

In an embodiment, the first lower glass substrate may include a plurality of first protrusion portions protruding toward the second lower glass substrate, and the second lower glass substrate may include a plurality of second protrusion portions protruding toward the first lower glass substrate.

In an embodiment, a refractive index of the adhesive member may be identical to a refractive index of at least one of the lower glass substrate and the upper glass substrate.

In an embodiment, at least one of the lower glass substrate and the upper glass substrate may be an ultra-thin tempered glass.

In an embodiment, the display panel may include a first surface facing the flexible cover window; and a second surface opposite to the first surface. The foldable display apparatus may be folded such that the first surface of the display panel faces itself with respect to the folding axis.

In an embodiment, the display panel may include a first surface facing the flexible cover window; and a second surface opposite to the first surface. The foldable display apparatus may be folded such that the second surface faces itself with respect to the folding axis.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
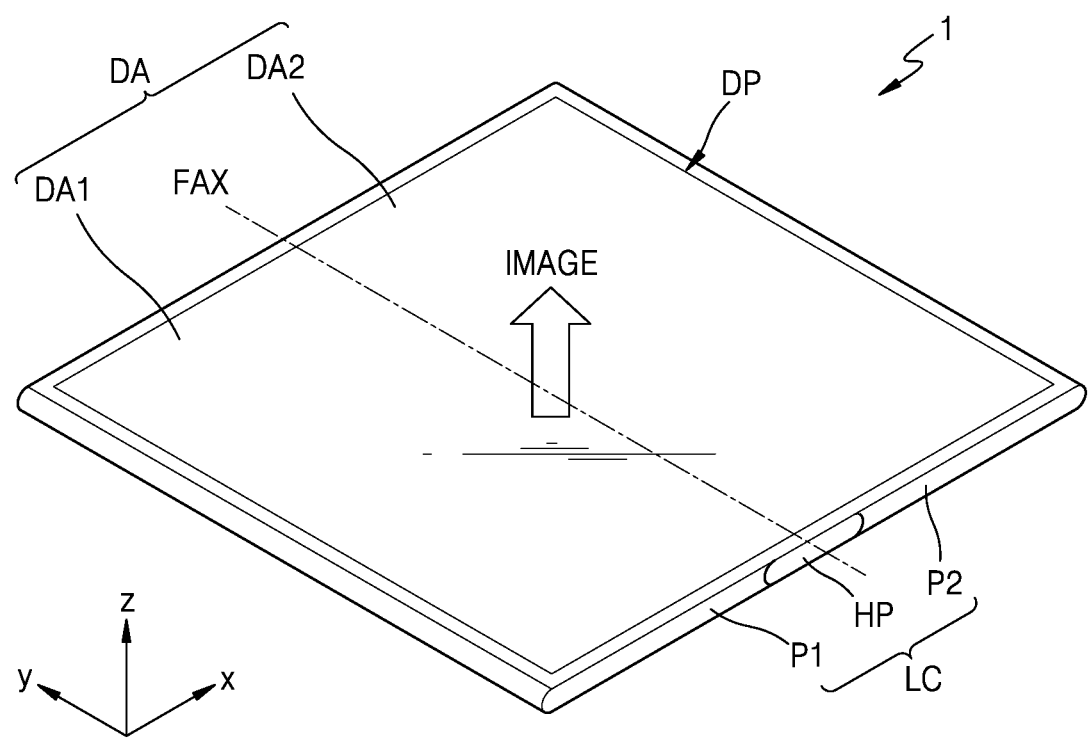
FIG. 1 is a schematic perspective view of a foldable display apparatus, according to an embodiment.

Reference will now be made in detail to embodiments, examples of which are illustrated in the accompanying drawings, wherein like reference numerals refer to like elements throughout. The embodiments may have different forms and should not be construed as being limited to the descriptions set forth herein. Accordingly, the embodiments are merely described below, by referring to the figures, to explain aspects of the present description. As used herein, the term "and" or "or" includes any and all combinations of one or more of the associated listed items. In the specification and the claims, the phrase "at least one of" is intended to include the meaning of "at least one selected from the group of" for the purpose of its meaning and interpretation. For example, "at least one of A and B" may be understood to mean "A, B, or A and B."

As the disclosure allows for various changes and numerous embodiments, particular embodiments will be illustrated in the drawings and described in detail in the written description. Hereinafter, effects and features of the present disclosure and a method for accomplishing them will be described more fully with reference to the accompanying drawings, in which embodiments of the disclosure are shown. This disclosure may, however, be embodied in many different forms and should not be construed as being limited to the embodiments set forth herein.

Hereinafter, embodiments of the disclosure will now be described in detail with reference to the accompanying drawings. When described with reference to the drawings, identical or corresponding elements will be given the same reference numerals, and redundant descriptions of these elements will be omitted.

It will be understood that although the terms "first," "second," or the like may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "on," "formed on," "located on," or "disposed on" another layer, region, or component, it can be directly or indirectly on, formed on, located on, or disposed on the other layer, region, or component. For example, intervening layers, regions, or components may be present.

Sizes of elements in the drawings may be exaggerated for convenience of explanation. For example, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or element is referred to as being "connected to" another layer, area, or element, it can be directly or indirectly connected to the other layer, region, or element. For example, intervening layers, regions, or elements may be present. For example, it will be understood that when a layer, region, or element is referred to as being "electrically connected to" another layer, area, or element, it can be directly or indirectly electrically connected to the other layer, region, or element. For example, intervening layers, regions, or elements may be present.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly defined in the specification.

Display apparatuses are apparatuses configured to display a video or a still image and may be used as display screens of various products such as televisions, laptops, monitors, billboards, or Internet of Things (IOTs) as well as mobile electronic devices such as mobile phones, smart phones, tablet personal computers (PCs), mobile communication terminals, electronic notebooks, e-books, portable multimedia players (PMPs), navigators, or ultra-mobile PCs (UMPCs). The display apparatuses according to an embodiment may be used in wearable devices such as smart watches, watch phones, glass-type displays, or head mounted displays (HMDs). The display apparatus according to an embodiment may be used as a vehicle's dashboard, a center information display (CID) located at a vehicle's center fascia or dashboard, a room mirror display covering for a vehicle's side-view mirror, or a display, which is located at the back of a front seat, as entertainment for a passenger in a back seat of a vehicle.

Figure 2:
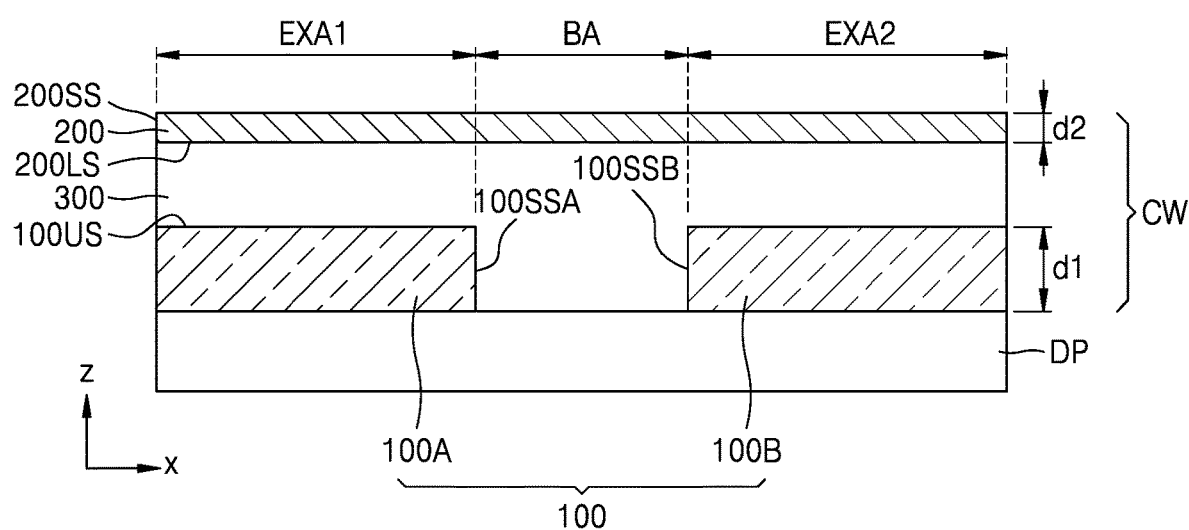
FIG. 2 is a schematic cross-sectional view of a display panel and a flexible cover window, according to an embodiment.

FIG. 1 is a schematic perspective view of a foldable display apparatus 1, according to an embodiment. FIG. 2 is a schematic cross-sectional view of a display panel DP and a flexible cover window CW, according to an embodiment.

Referring to FIG. 1, the foldable display apparatus 1 may include the display panel DP, the flexible cover window CW (see, e.g., FIG. 2), and a lower cover LC. The lower cover LC may include a first portion P1 and a second portion P2 supporting the display panel DP. The lower cover LC may be folded with respect to a folding axis FAX between the first portion P1 and the second portion P2. In an embodiment, the lower cover LC may include a hinge portion HP between the first portion P1 and the second portion P2.

The display panel DP may include a display area DA. Pixels (not shown) are arranged in the display area DA of the display panel DP to display an image. The pixels may each emit red, green, or blue light. As another example, in another embodiment, the pixels may each emit red, green, blue, or white light. Hereinafter, for convenience of description, parts arranged at left and right sides with respect to the folding axis FAX in the display area DA are referred to as a first display area DA1 and a second display area DA2, respectively.

The display panel DP may be folded with respect to the folding axis FAX intersecting the display area DA. For example, the display panel DP may be folded together with the lower cover LC and the flexible cover window CW, and the parts of the display panel DP, which are folded with respect to the folding axis FAX intersecting the display area DA, may face each other. As another example, the foldable display apparatus 1 may be folded such that the first portion P1 and the second portion P2 face each other.

In some embodiments, the display panel DP may be folded with respect to multiple folding axes FAXs intersecting the display area DA. Hereinafter, a case where the display panel DP is folded with respect to one folding axis FAX will be described in detail.

FIG. 1 illustrates that the folding axis FAX extends in a y-direction, but in another embodiment, the folding axis FAX may extend in an x-direction. As another example, the folding axis FAX on an xy-plane may also extend in a direction intersecting the x-direction and the y-direction.

The flexible cover window CW may be easily folded in response to external force without generation of cracks or the like and may protect the display panel DP. The flexible cover window CW may be disposed on the display panel DP. The flexible cover window CW may be attached to the display panel DP. In an embodiment, the flexible cover window CW may be attached to the display panel DP by a pressure-sensitive adhesive (PSA).

Referring to FIGS. 1 and 2, the flexible cover window CW may include a lower glass substrate 100, an upper glass substrate 200, and an adhesive member 300. The lower glass substrate 100 and the upper glass substrate 200 may include glass, sapphire, or plastic. In some embodiments, the lower glass substrate 100 and the upper glass substrate 200 may include the same material.

In an embodiment, at least one of the lower glass substrate 100 and the upper glass substrate 200 may be an ultra-thin tempered glass (UTG). For example, the lower glass substrate 100 may be a UTG, and the upper glass substrate 200 may be glass. As another example, the lower glass substrate 100 may be glass, and the upper glass substrate 200 may be a UTG. As another example, both the lower glass substrate 100 and the upper glass substrate 200 may be UTGs. In some embodiments, at least one of the lower glass substrate 100 and the upper glass substrate 200 may be a glass substrate treated by a physical strengthening method or a chemical strengthening method using an ion exchange method. For example, the upper glass substrate 200 may be a glass substrate treated by the physical strengthening method or the chemical strengthening method using the ion exchange method. As another example, both the lower glass substrate 100 and the upper glass substrate 200 may be glass substrates treated by the physical strengthening method or the chemical strengthening method using the ion exchange method.

The lower glass substrate 100 may include a first lower glass substrate 100A and a second lower glass substrate 100B. The first lower glass substrate 100A and the second lower glass substrate 100B may be spaced apart from each other. In this case, the first lower glass substrate 100A may be located corresponding to the first display area DA1 and/or the first portion P1, and the second lower glass substrate 100B may be located corresponding to the second display area DA2 and/or the second portion P2.

In an embodiment, a thickness of the first lower glass substrate 100A may be identical to a thickness of the second lower glass substrate 100B. The thickness of the first lower glass substrate 100A may be defined as the shortest distance between an upper surface of the first lower glass substrate 100A and a lower surface of the first lower glass substrate 100A, and in FIG. 2, the thickness of the first lower glass substrate 100A may be a distance in a z-direction between the upper surface of the first lower glass substrate 100A and the lower surface of the first lower glass substrate 100A. The thickness of the second lower glass substrate 100B may be defined as the shortest distance between an upper surface of the second lower glass substrate 100B and a lower surface of the second lower glass substrate 100B, and in FIG. 2, the thickness of the second lower glass substrate 100B may be a distance in the z-direction between the upper surface of the second lower glass substrate 100B and the lower surface of the second lower glass substrate 100B. In another embodiment, the thickness of the first lower glass substrate 100A may be different from the thickness of the second lower glass substrate 100B. Hereinafter, a case where the first lower glass substrate 100A and the second lower glass substrate 100B have the same thickness will be described in detail.

The upper glass substrate 200 may be disposed above the lower glass substrate 100. The upper glass substrate 200 may be disposed above the first lower glass substrate 100A and the second lower glass substrate 100B. The upper glass substrate 200 may extend from above the first lower glass substrate 100A to above the second lower glass substrate 100B. In another example, the upper glass substrate 200 may extend from above the second lower glass substrate 100B to above the first lower glass substrate 100A. For example, the upper glass substrate 200 may also be disposed over a space between the first lower glass substrate 100A and the second lower glass substrate 100B.

In an embodiment, the upper glass substrate 200 may be easily bent in response to external force without generation of cracks or the like. For example, the upper glass substrate 200 may be folded in response to external force. In this case, the flexible cover window CW may include a first extension area EXA1, a second extension area EXA2, and a bending area BA, and the upper glass substrate 200 may be folded by bending the bending area BA of the upper glass substrate 200. FIG. 2 illustrates that the upper glass substrate 200 includes one bending area BA, but in another embodiment, the upper glass substrate 200 may include multiple bending areas. The first extension area EXA1 and the second extension area EXA2 may be connected to corresponding sides of the bending area BA, respectively. For example, in FIG. 2, the first extension area EXA1 may extend from the bending area BA in a negative x-direction, and the second extension area EXA2 may extend from the bending area BA in an x-direction.

In an embodiment, the first lower glass substrate 100A and the second lower glass substrate 100B may be spaced apart from each other with respect to the bending area BA. For example, the first lower glass substrate 100A may be disposed under the first extension area EXA1, and the second lower glass substrate 100B may be disposed under the second extension area EXA2. In some embodiments, a portion of the first lower glass substrate 100A and/or a portion of the second lower glass substrate 100B may extend to the bending area BA.

For example, the first lower glass substrate 100A may overlap only the first extension area EXA1. As another example, the portion of the first lower glass substrate 100A may extend in the x-direction of FIG. 2 to overlap the bending area BA. The second lower glass substrate 100B may overlap only the second extension area EXA2. As another example, the portion of the second lower glass substrate 100B may extend in the negative x-direction of FIG. 2 to overlap the bending area BA.

In an embodiment, the upper glass substrate 200 may be thinner than the lower glass substrate 100. For example, a second thickness d2 of the upper glass substrate 200 may be less than a first thickness d1 of the lower glass substrate 100. The first thickness d1 of the lower glass substrate 100 may be a distance between a lower surface of the lower glass substrate 100 facing the display panel DP and an upper surface 100US of the lower glass substrate 100 opposite to the lower surface of the lower glass substrate 100. The second thickness d2 of the upper glass substrate 200 may be a distance between a lower surface 200LS of the upper glass substrate 200 facing the lower glass substrate 100 and an upper surface of the upper glass substrate 200 opposite to the lower surface 200LS of the upper glass substrate 200.

In an embodiment, the flexible cover window CW may be easily bent in response to external force. In this case, the bending area BA of the upper glass substrate 200 may be bent. Because the second thickness d2 of the upper glass substrate 200 is relatively less than the first thickness d1 of the lower glass substrate 100, the upper glass substrate 200 has less stiffness than the lower glass substrate 100 and thus may be easily bent. For example, it is possible to reduce repulsive force against bending. The first lower glass substrate 100A and the second lower glass substrate 100B may be located in the first extension area EXA1 and the second extension area EXA2, respectively, and may protect the display panel DP. In this case, because the lower glass substrate 100 may be thicker than the upper glass substrate 200, the lower glass substrate 100 may protect the display panel DP from external impact. For example, the flexible cover window CW according to an embodiment of the disclosure may reduce repulsive force against bending and may easily protect the display panel DP from external impact.

In an experimental example, a strength of the flexible cover window CW may be measured as a height of a pen in case that the flexible cover window CW is damaged by dropping the pen from a certain height to the flexible cover window CW. For example, in case that the pen is dropped from a first height, the flexible cover window CW including one upper glass substrate may be damaged. In case that the pen is dropped from a second height, the flexible cover window CW including an upper glass substrate and a lower glass substrate, which have the same thickness, may be damaged. The second height may be about 1.5 to 5 times higher than the first height. In case that the flexible cover window CW includes the upper glass substrate and the lower glass substrate that is 5 times thicker than the upper glass substrate, a third height of the pen at which the flexible cover window CW is damaged is about 2 to 3 times higher than the second height.

The adhesive member 300 may be disposed between the lower glass substrate 100 and the upper glass substrate 200. The adhesive member 300 may be continuously located in the first extension area EXA1, the second extension area EXA2, and the bending area BA of the upper glass substrate 200. For example, the adhesive member 300 may extend from the bending area BA of the upper glass substrate 200 to between the upper surface 100US of the lower glass substrate 100 and the lower surface 200LS of the upper glass substrate 200. Accordingly, the adhesive member 300 may connect the lower glass substrate 100 and the upper glass substrate 200.

The adhesive member 300 may extend between the first lower glass substrate 100A and the second lower glass substrate 100B. For example, the adhesive member 300 may extend between a side surface 100SSA of the first lower glass substrate 100A and a side surface 100SSB of the second lower glass substrate 100B, which face each other. Accordingly, the adhesive member 300 may fill the space between the first lower glass substrate 100A and the second lower glass substrate 100B and may increase the durability of the flexible cover window CW.

The adhesive member 300 may connect the first lower glass substrate 100A to the second lower glass substrate 100B, and the adhesive member 300 may connect the first lower glass substrate 100A, the second lower glass substrate 100B, and the upper glass substrate 200 to each other. In some embodiments, the adhesive member 300 may also be connected to the display panel DP.

In an embodiment, the adhesive member 300 may include a resin. For example, the adhesive member 300 may be an optically clear resin (OCR) and may include at least one of acrylic, epoxy, silicon, and urethane resin. In an embodiment, the adhesive member 300 may be a PSA.

In an embodiment, the adhesive member 300 is transparent to transmit light. For example, a refractive index of the adhesive member 300 may be identical to at least one of a refractive index of the lower glass substrate 100 and a refractive index of the upper glass substrate 200. For example, the refractive index of the adhesive member 300 may be identical to the refractive index of the lower glass substrate 100 and the refractive index of the upper glass substrate 200. The refractive index of the adhesive member 300 may be substantially identical to a refractive index of a glass. Accordingly, the refraction of the light transmitting through the flexible cover window CW may be reduced at a boundary between the lower glass substrate 100 and the adhesive member 300 or a boundary between the adhesive member 300 and the upper glass substrate 200.

In some embodiments, an upper portion of the upper glass substrate 200 may further include a protective layer (not shown) protecting an upper surface of the flexible cover window CW. The protective layer may include at least one of a hard coating layer reinforcing strength and a fingerprint prevention layer. In some embodiments, a scattering prevention layer (not shown) may be between the flexible cover window CW and the display panel DP. In case that the lower glass substrate 100 is broken, the scattering prevention layer may fix the broken lower glass substrate 100. For example, the scattering prevention layer may include a polyurethane resin.

Figure 3:
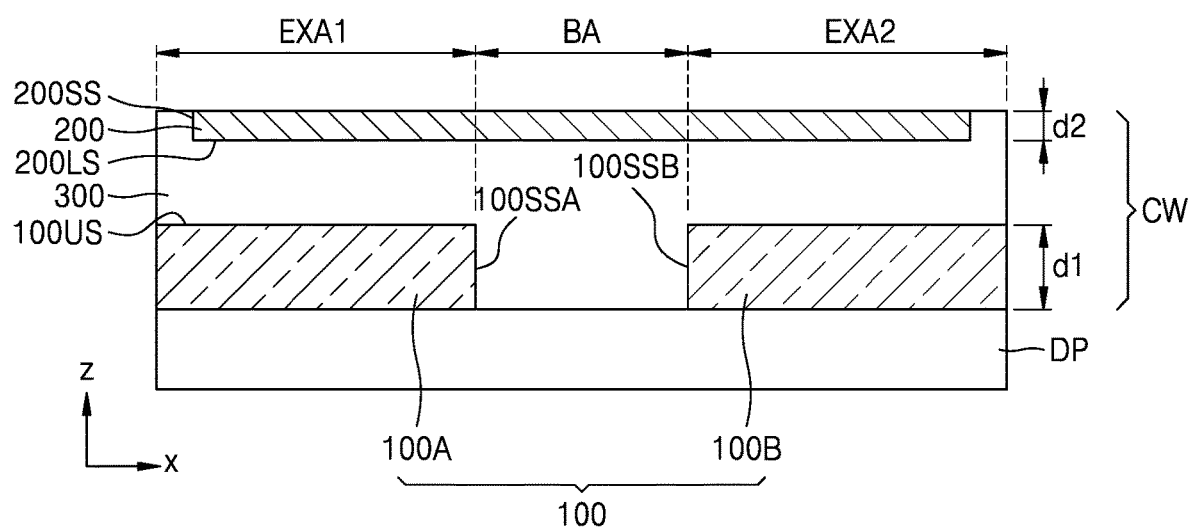
FIG. 3 is a schematic cross-sectional view of a display panel and a flexible cover window, according to another embodiment.

FIG. 3 is a schematic cross-sectional view of a display panel DP and a flexible cover window CW, according to another embodiment.

Referring to FIG. 3, a foldable display apparatus may include the display panel DP and the flexible cover window CW. The flexible cover window CW may include the lower glass substrate 100, the upper glass substrate 200 that is disposed above the lower glass substrate 100 and is thinner than the lower glass substrate 100, and the adhesive member 300 between the lower glass substrate 100 and the upper glass substrate 200. The lower glass substrate 100 may include the first lower glass substrate 100A and the second lower glass substrate 100B spaced apart from each other, and the adhesive member 300 may extend between the first lower glass substrate 100A and the second lower glass substrate 100B.

In an embodiment, the upper glass substrate 200 may include the lower surface 200LS of the upper glass substrate 200 and a side surface 200SS of the upper glass substrate 200, the lower surface 200LS facing the lower glass substrate 100 and the side surface 200SS intersecting the lower surface 200LS of the upper glass substrate 200. The side surface 200SS of the upper glass substrate 200 may be an end portion of the upper glass substrate 200. In this case, the adhesive member 300 may extend from the lower surface 200LS of the upper glass substrate 200 to the side surface 200SS of the upper glass substrate 200. Accordingly, the adhesive member 300 may cover the side surface 200SS of the upper glass substrate 200. Because the adhesive member 300 covers the side surface 200SS of the upper glass substrate 200, damage to an edge of the upper glass substrate 200 may be prevented. In some embodiments, the end portion of the upper glass substrate 200 may be surrounded by a cover member and the adhesive member 300. Accordingly, damage to the end portion of the upper glass substrate 200 may be prevented.

Figure 4A:
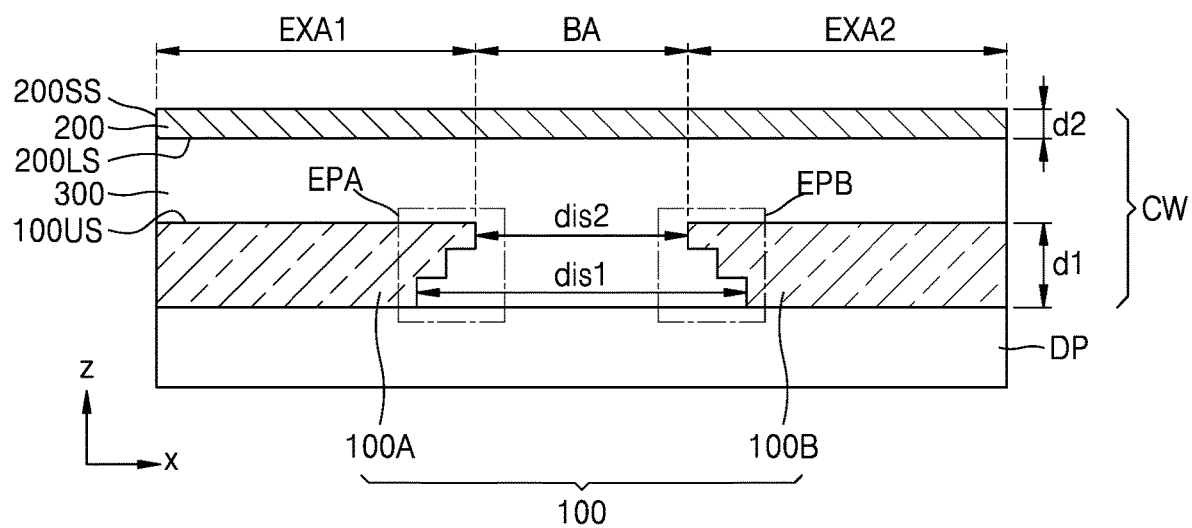
FIG. 4A and FIG. 4B are each a schematic cross-sectional view of a display panel and a flexible cover window, according to another embodiment.
Figure 4B:
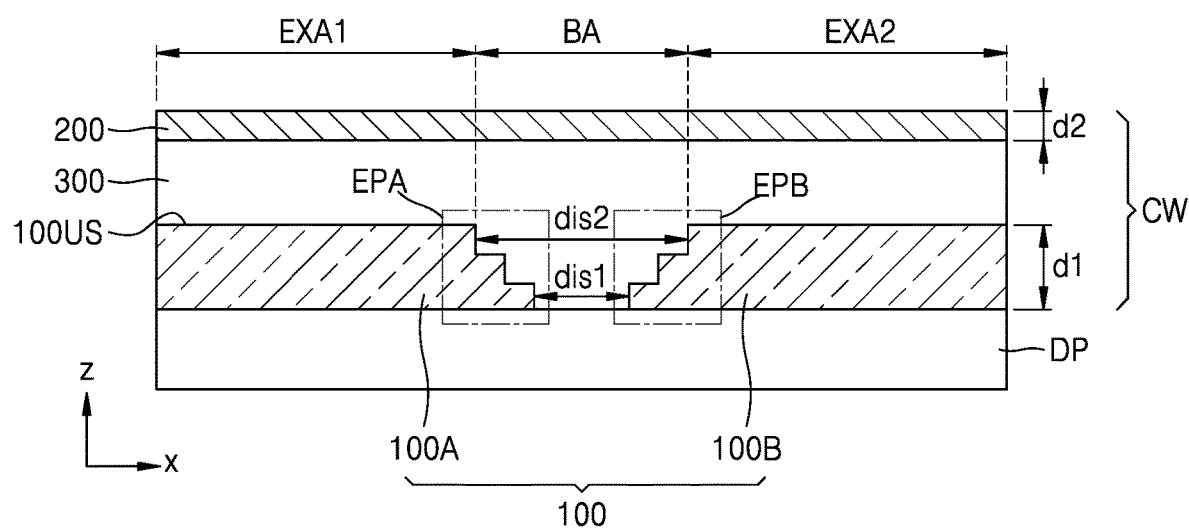

FIG. 4A and FIG. 4B are each a schematic cross-sectional view of a display panel and a flexible cover window, according to another embodiment.

Referring to FIG. 4A and FIG. 4B, a foldable display apparatus may include the display panel DP and the flexible cover window CW. The flexible cover window CW may include the lower glass substrate 100, the upper glass substrate 200 that is disposed above the lower glass substrate 100 and is thinner than the lower glass substrate 100, and the adhesive member 300 between the lower glass substrate 100 and the upper glass substrate 200. The lower glass substrate 100 may include the first lower glass substrate 100A and the second lower glass substrate 100B spaced apart from each other, and the adhesive member 300 may extend between the first lower glass substrate 100A and the second lower glass substrate 100B.

In an embodiment, an end portion EPA of the first lower glass substrate 100A and an end portion EPB of the second lower glass substrate 100B, which face each other, may respectively include at least two step shapes. For example, the end portion EPA of the first lower glass substrate 100A and the end portion EPB of the second lower glass substrate 100B may include a step. The end portion EPA of the first lower glass substrate 100A may overlap at least one of the first extension area EXA1 and the bending area BA. The end portion EPB of the second lower glass substrate 100B may overlap at least one of the second extension area EXA2 and the bending area BA.

The at least two step shapes may minimize visibility of the boundary between the lower glass substrate 100 and the adhesive member 300. For example, even in case that a refractive index of the lower glass substrate 100 is slightly different from a refractive index of the adhesive member 300, the at least two step shapes may minimize or reduce the visibility of the boundary between the lower glass substrate 100 and the adhesive member 300, due to a difference between the refractive indices.

A restoring force of the adhesive member 300 may be improved by having the at least two step shapes at the end portion EPA of the first lower glass substrate 100A and the end portion EPB of the second lower glass substrate 100B. For example, in case that the adhesive member 300 repeatedly stretches or contracts, fatigue failure of the adhesive member 300 may be prevented.

An area where the lower glass substrate 100 contacts the adhesive member 300 may increase, and thus a degree of adhesion between the lower glass substrate 100 and the adhesive member 300 may increase.

Referring to FIG. 4A, a distance between the end portion EPA of the first lower glass substrate 100A and the end portion EPB of the second lower glass substrate 100B, which face each other, may decrease in a direction toward the upper glass substrate 200 from the lower glass substrate 100. In this case, the adhesive member 300 may be between the first lower glass substrate 100A and the second lower glass substrate 100B. Accordingly, a width of the adhesive member 300 may decrease in a direction toward the upper glass substrate 200 from the lower glass substrate 100. For example, a second width dis2 of the adhesive member 300 between the upper surfaces 100US of the lower glass substrate 100 may be less than a first width dis1 of the adhesive member 300 facing the display panel DP. As another example, in some embodiments, the first width dis1 may be defined as a width of the adhesive member 300 exposed between the first lower glass substrate 100A and the second lower glass substrate 100B.

Referring to FIG. 4B, a distance between the end portion EPA of the first lower glass substrate 100A and the end portion EPB of the second lower glass substrate 100B, which face each other, may increase in a direction toward the upper glass substrate 200 from the lower glass substrate 100. In this case, a width of the adhesive member 300 may increase in a direction toward the upper glass substrate 200 from the lower glass substrate 100. For example, a second width dis2 of the adhesive member 300 between the upper surfaces 100US of the lower glass substrate 100 may be greater than a first width dis1 of the adhesive member 300 facing the display panel DP.

FIG. 5A to FIG. 5E are each a plan view of a portion of a flexible cover window, according to various embodiments. FIG. 5A to FIG. 5E are each a plan view of portions of the first lower glass substrate 100A, the second lower glass substrate 100B, and the adhesive member 300.

Referring to FIG. 5A to FIG. 5E, a lower glass substrate may include the first lower glass substrate 100A and the second lower glass substrate 100B spaced apart from each other, and the adhesive member 300 may be between the first lower glass substrate 100A and the second lower glass substrate 100B. The first lower glass substrate 100A may overlap the first extension area EXA1 of an upper glass substrate, and the second lower glass substrate 100B may overlap the second extension area EXA2 of the upper glass substrate.

In an embodiment, the first lower glass substrate 100A may include a first protrusion portion PPA protruding toward the second lower glass substrate 100B. The first protrusion portion PPA may protrude in a direction toward the bending area BA from the first extension area EXA1. In an embodiment, the first protrusion portion PPA may overlap the bending area BA. In another embodiment, the first protrusion portion PPA may overlap both the bending area BA and the first extension area EXA1. In another embodiment, the first protrusion portion PPA may overlap the first extension area EXA1. Multiple first protrusion portions PPA may be provided, and a first recess RA may be disposed between two first protrusion portions PPA adjacent to each other. In some embodiments, the first lower glass substrate 100A may not include the first protrusion portion PPA.

The second lower glass substrate 100B may include a second protrusion portion PPB protruding toward the first lower glass substrate 100A. The second protrusion portion PPB may protrude in a direction toward the bending area BA from the second extension area EXA2. In an embodiment, the second protrusion portion PPB may overlap the bending area BA. In another embodiment, the second protrusion portion PPB may overlap both the bending area BA and the second extension area EXA2. In another embodiment, the second protrusion portion PPB may overlap the second extension area EXA2. Multiple second protrusion portions PPB may be provided in a multiple number, and second recess RB may be disposed between two second protrusion portions PPB adjacent to each other. In some embodiments, the second lower glass substrate 100B may not include the second protrusion portion PPB.

By means of the first protrusion portion PPA, a contact area between the first lower glass substrate 100A and the adhesive member 300 increases, and thus a degree of adhesion between the first lower glass substrate 100A and the adhesive member 300 may increase. By means of the second protrusion portion PPB, a contact area between the second lower glass substrate 100B and the adhesive member 300 increases, and thus a degree of adhesion between the second lower glass substrate 100B and the adhesive member 300 may increase.

A restoring force of the adhesive member 300 may be improved by means of at least one of the first protrusion portion PPA and the second protrusion portion PPB. For example, in case that the adhesive member 300 repeatedly stretches or contracts, the first protrusion portion PPA and the second protrusion portion PPB may prevent fatigue failure of the adhesive member 300.

Figure 5A:
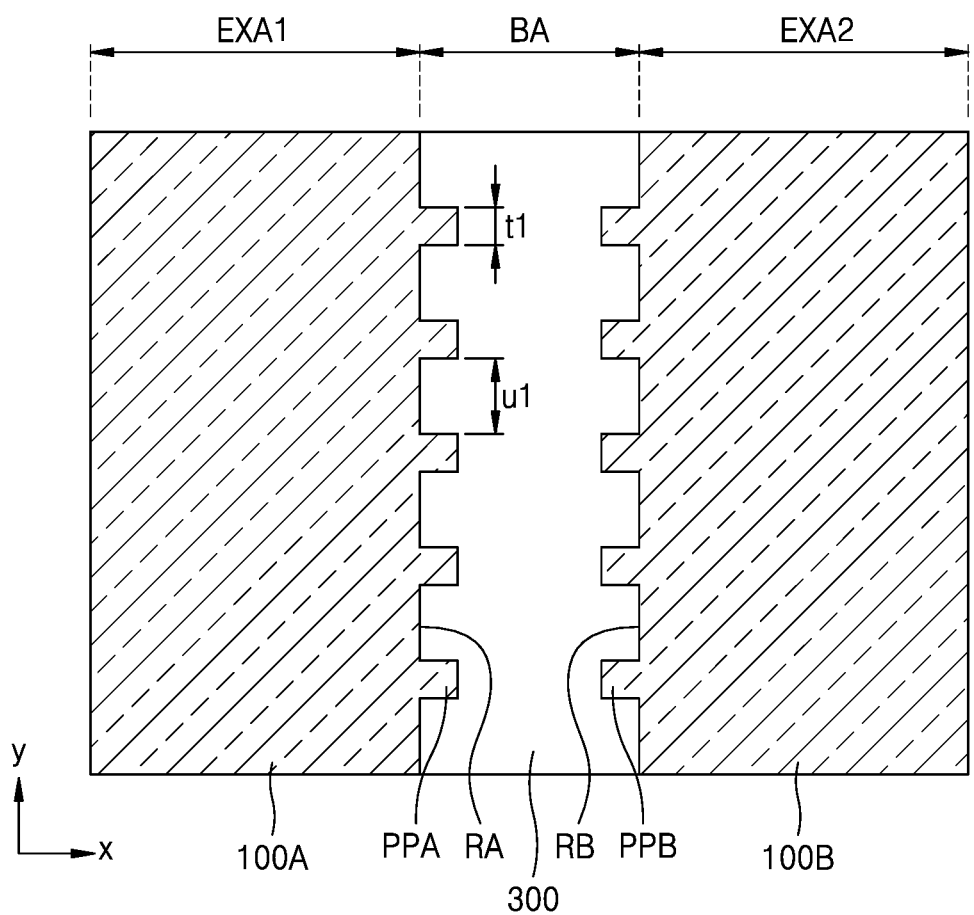
FIG. 5A to FIG. 5E are each a top plan view of a portion of a flexible cover window, according to various embodiments.

Referring to FIG. 5A, each of first protrusion portions PPA may face corresponding one of the second protrusion portions PPB. In this case, a planar shape of the first lower glass substrate 100A and a planar shape of the second lower glass substrate 100B may be symmetrical to each other with respect to the adhesive member 300.

A width t1 of the first protrusion portion PPA may be less than a width u1 of the first recess RA. The width t1 of the first protrusion portion PPA may be defined as a length in a y-direction of FIG. 5A. The width u1 of the first recess RA may be defined as a distance between two first protrusion portions PPA adjacent to each other in the y-direction. Similarly, a width of the second protrusion portion PPB may be less than a width of the second recess RB.

Figure 5B:
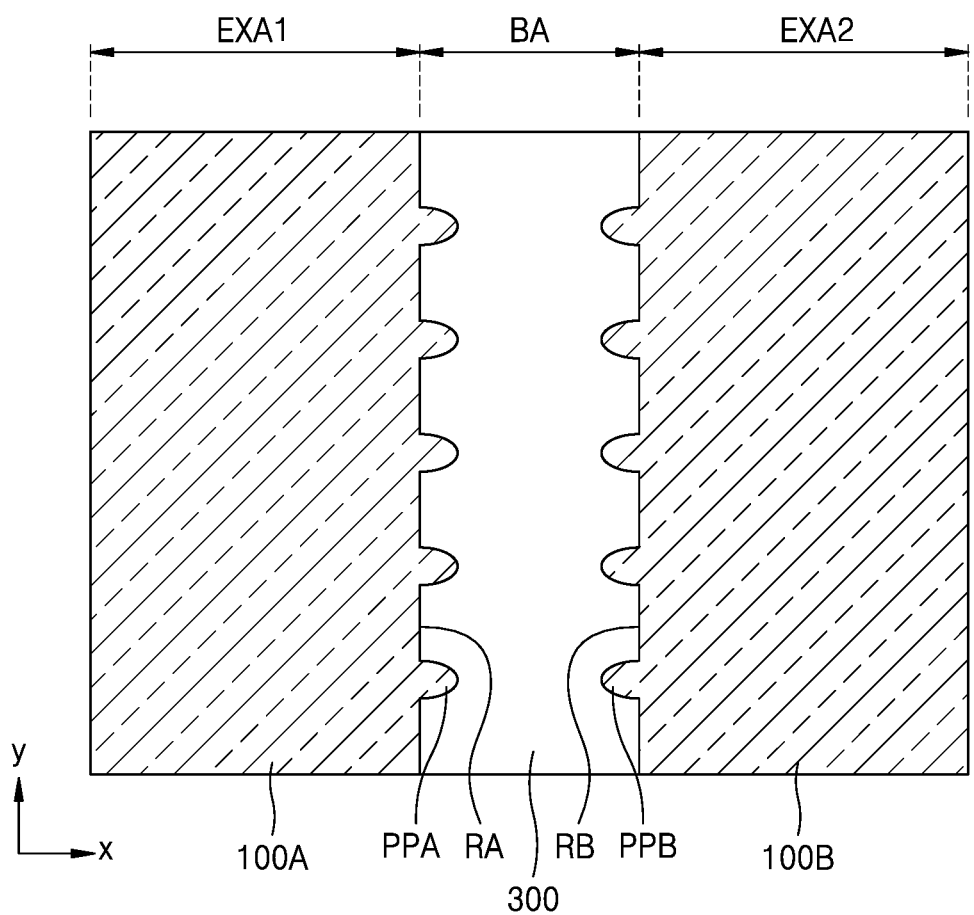

Referring to FIG. 5B, at least one of the first protrusion portion PPA and the second protrusion portion PPB may include a curvature portion. For example, at least one of the first protrusion portion PPA and the second protrusion portion PPB may have a semi-elliptical shape or a semi-circular shape.

Figure 5C:
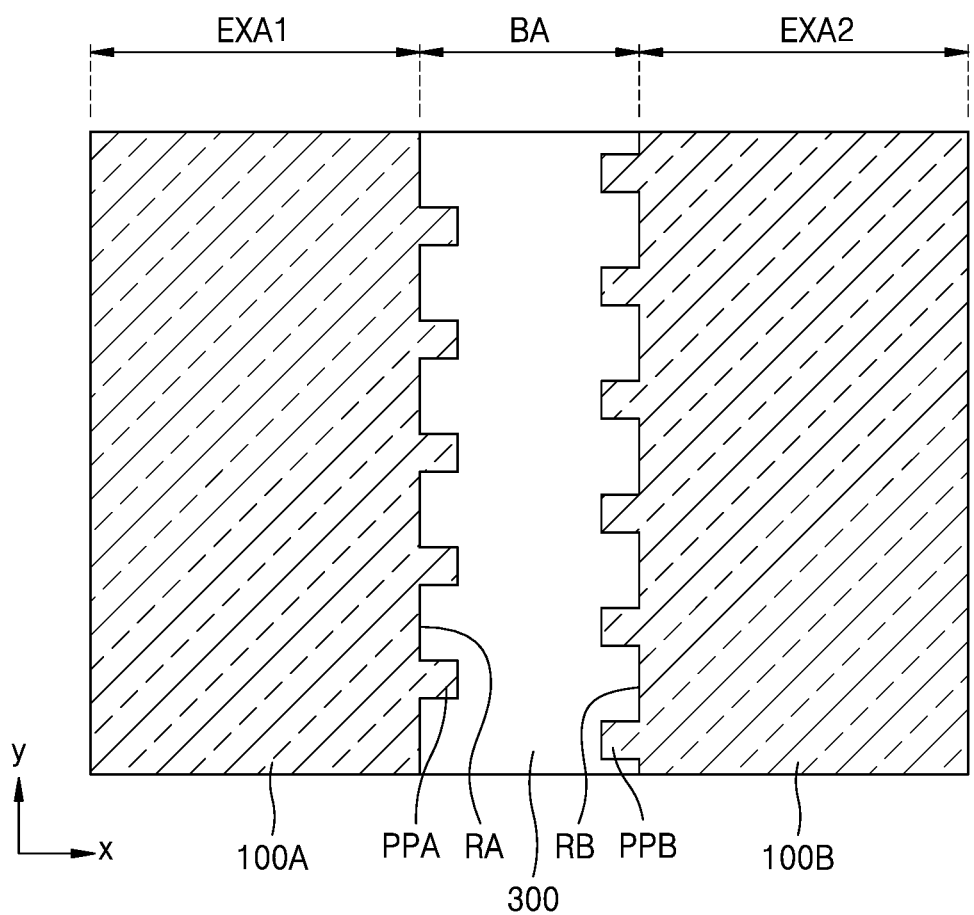

Referring to FIG. 5C, each of first protrusion portions PPA may face corresponding one of second recesses RB. Each of second protrusion portions PPB may face corresponding one of first recesses RA. Accordingly, the first protrusion portions PPA and the second protrusion portions PPB may be alternately arranged.

A width of the first protrusion portion PPA may be less than a width of the first recess RA. Similarly, a width of the second protrusion portion PPB may be less than a width of the second recess RB.

Figure 5D:
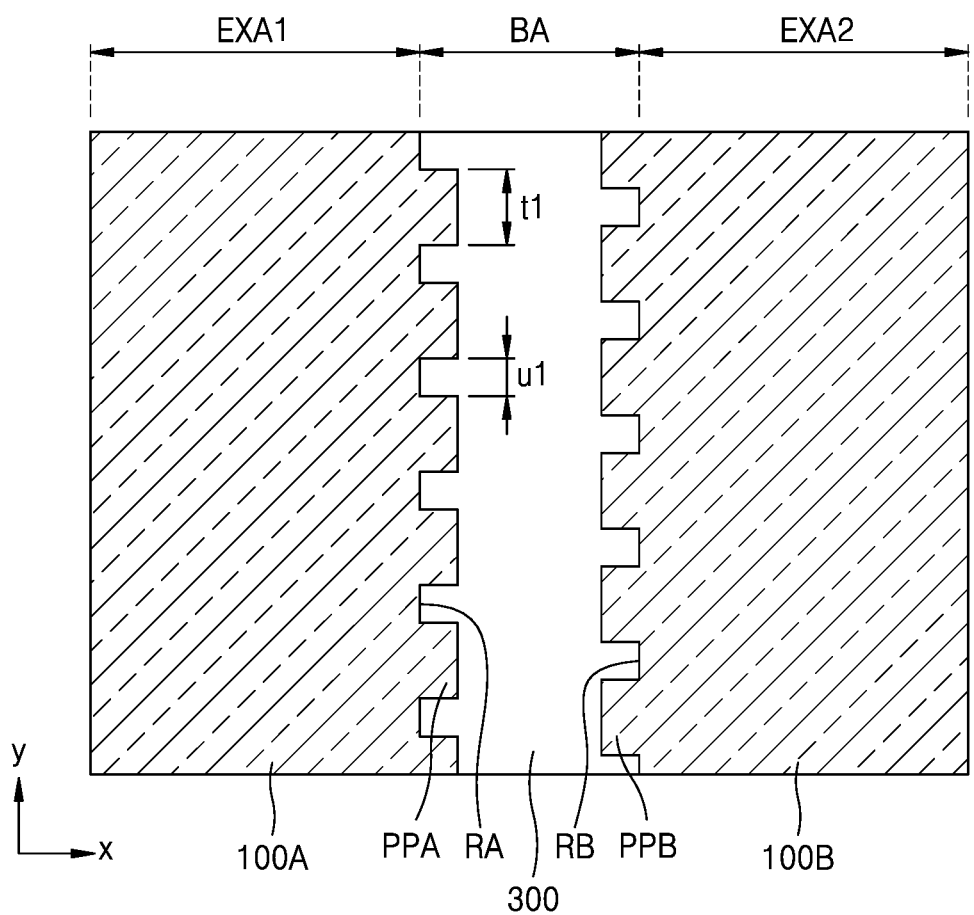

Referring to FIG. 5D, each of first protrusion portions PPA may face corresponding one of second recesses RB. Each of second protrusion portions PPB may face corresponding one of first recesses RA.

A width t1 of the first protrusion portion PPA may be greater than a width u1 of the first recess RA. Similarly, a width of the second protrusion portion PPB may be greater than a width of the second recess RB.

Figure 5E:
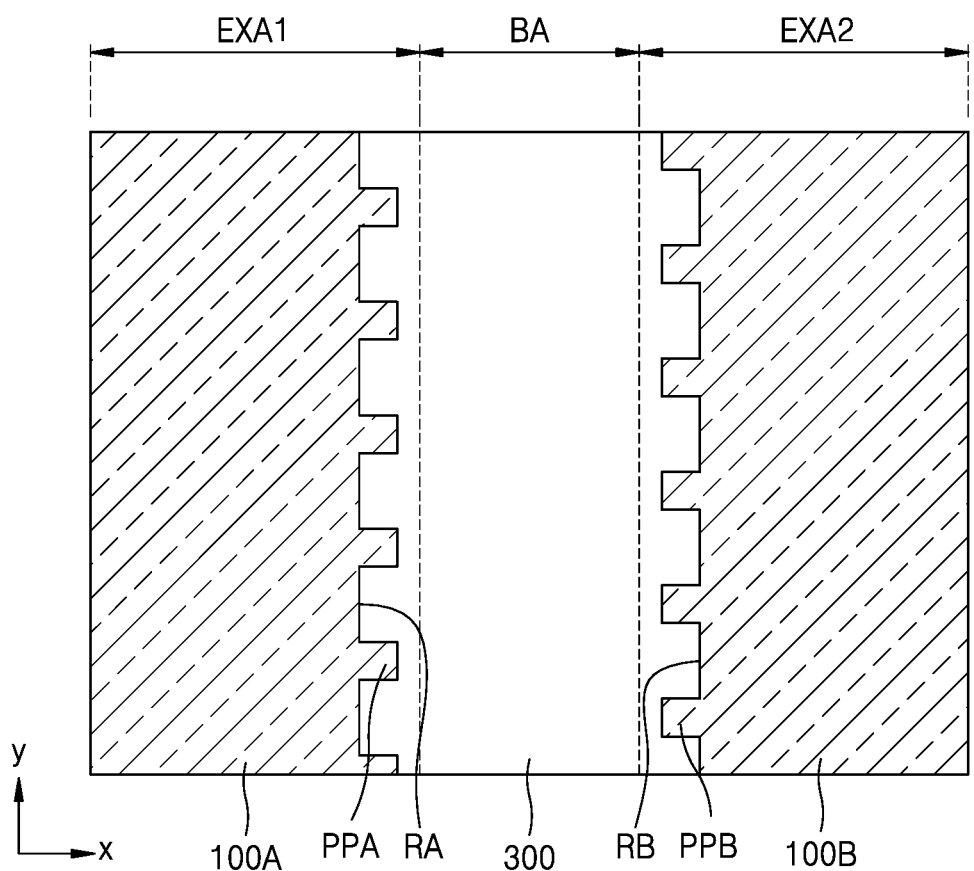

Referring to FIG. 5E, the first protrusion portion PPA may overlap the first extension area EXA1, and the second protrusion portion PPB may overlap the second extension area EXA2. In this case, a portion of the adhesive member 300 may overlap the first extension area EXA1, and another portion of the adhesive member 300 may overlap the second extension area EXA2.

Figure 6:
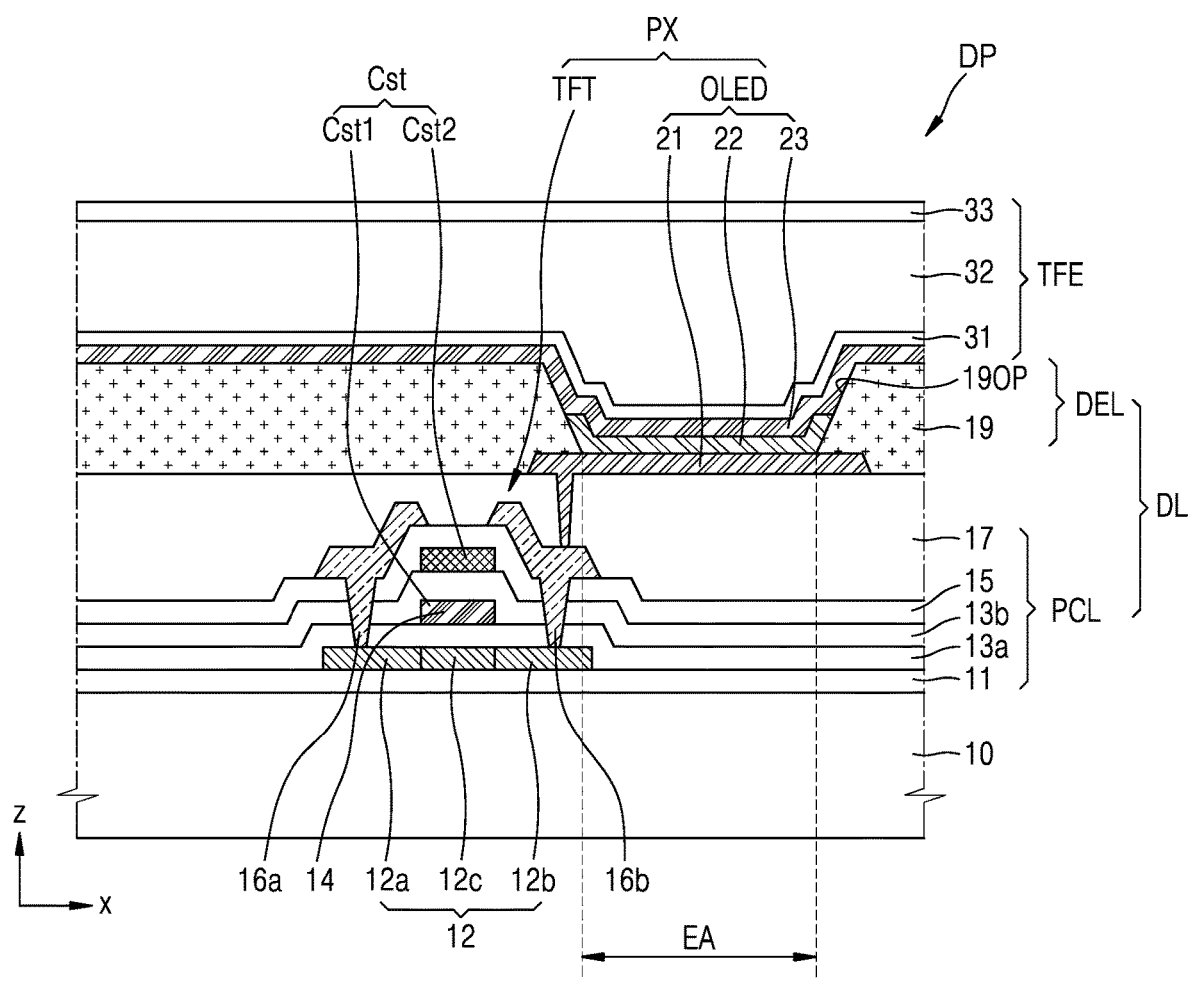
FIG. 6 is a schematic cross-sectional view of a display panel, according to an embodiment.

FIG. 6 is a schematic cross-sectional view of a display panel DP, according to an embodiment.

The display panel DP may be a light-emitting display panel including a light-emitting element. For example, the display panel DP may be an organic light-emitting display panel using an organic light-emitting diode including an organic light-emitting layer, a micro light-emitting diode display panel using a micro light-emitting diode (micro LED), a quantum dot light-emitting display panel using a quantum dot light-emitting diode including a quantum dot light-emitting layer, or an inorganic light-emitting display panel using an inorganic light-emitting diode including an inorganic semiconductor. Hereinafter, a case where the display panel DP is an organic light-emitting display panel will be described in detail.

Referring to FIG. 6, in the display panel DP, a display layer DL and a thin-film encapsulation layer TFE may be disposed on a substrate 10. The display layer DL may include a pixel circuit layer PCL and a display element layer DEL.

The substrate 10 may include glass or may include polymer resin such as polyethersulfone, polyarylate, polyetherimide, polyethylene naphthalate, polyethylene terephthalate, polyphenylene sulfide, polyimide, polycarbonate, cellulose triacetate, or cellulose acetate propionate.

A barrier layer (not shown) may be further between the display layer DL and the substrate 10. The barrier layer prevents penetration of foreign substances and may include a single layer or multiple layers, which include an organic material such as silicon nitride (SiNx) or silicon oxide (SiOx).

The pixel circuit layer PCL is disposed on the substrate 10. FIG. 6 illustrates the pixel circuit layer PCL including a thin-film transistor TFT, and a buffer layer 11, a first gate insulating layer 13a, a second gate insulating layer 13b, an insulating interlayer 15, and a flattening insulating layer 17, which are disposed under or/and above elements of the thin-film transistor TFT.

The buffer layer 11 may include an inorganic insulation material such as silicon nitride, silicon oxynitride, and silicon oxide, and may include a single layer or a multiple layers, which include the inorganic insulation material.

The thin-film transistor TFT may include a semiconductor layer 12, and the semiconductor layer 12 may include polysilicon. As another example, the semiconductor layer 12 may include amorphous silicon, an oxide semiconductor, or an organic semiconductor. The semiconductor layer 12 may include a channel area 12c, and a drain area 12a and a source area 12b respectively at corresponding sides of the channel area 12c. A gate electrode 14 may overlap the channel area 12c.

The gate electrode 14 may include a low-resistance metal material. The gate electrode 14 may include a conductive material including molybdenum (Mo), aluminum (Al), copper (Cu), titanium (Ti), or the like, and may include multiple layers or a single layer, which includes the conductive material.

The first gate insulating layer 13a between the semiconductor layer 12 and the gate electrode 14 may include an inorganic insulation material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), or the like.

The second gate insulating layer 13b may cover the gate electrode 14. Similar to the first gate insulating layer 13a, the second gate insulating layer 13b may include an inorganic insulation material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), or the like.

An upper electrode Cst2 of a storage capacitor Cst may be disposed on the second gate insulating layer 13b. The upper electrode Cst2 may overlap the gate electrode 14 thereunder. The gate electrode 14 and the upper electrode Cst2, which overlap each other and the second gate insulating layer 13b therebetween, may form the storage capacitor Cst. For example, the gate electrode 14 may function as a lower electrode Cst1 of the storage capacitor Cst.

Thus, the storage capacitor Cst and the thin-film transistor TFT may be formed to overlap each other. In some embodiments, the storage capacitor Cst may be formed not to overlap the thin-film transistor TFT.

The upper electrode Cst2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or multiple layers of aforementioned material.

The insulating interlayer 15 may cover the upper electrode Cst2. The insulating interlayer 15 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), or the like. The insulating interlayer 15 may include a single layer or multiple layers, which include aforementioned inorganic insulation material.

Each of a drain electrode 16a and a source electrode 16b may be disposed on the insulating interlayer 15. The drain electrode 16a and the source electrode 16b may be electrically connected to the drain area 12a and the source area 12b, respectively, via contact holes in the first gate insulating layer 13a, the second gate insulating layer 13b, and the insulating interlayer 15. The drain electrode 16a and the source electrode 16b may include a material with conductivity. The drain electrode 16a and the source electrode 16b may include a conductive material including molybdenum (Mo), aluminum (Al), copper (Cu), titanium (Ti), or the like, and may include multiple layers or a single layer, which includes the material. In an embodiment, the drain electrode 16a and the source electrode 16b may have a multi-layer structure of Ti/Al/Ti.

The flattening insulating layer 17 may include an organic insulating layer. The flattening insulating layer 17 may include an organic insulation material such as general-purpose polymer such as polymethylmethacrylate (PMMA) or polystyrene (PS), polymer derivative having a phenol-based group, acryl-based polymer, imide-based polymer, aryl ether-based polymer, amide-based polymer, fluorine-based polymer, p-xylene-based polymer, vinyl alcohol-based polymer, and a blend thereof.

The display element layer DEL is disposed on the pixel circuit layer PCL having the aforementioned structure. The display element layer DEL includes an organic light-emitting diode OLED, and a pixel electrode 21 of the organic light-emitting diode OLED may be electrically connected to the thin-film transistor TFT via a contact hole of the flattening insulating layer 17.

A pixel PX may include the organic light-emitting diode OLED and the thin-film transistor TFT. Each pixel PX may emit, for example, red, green, or blue light from the organic light-emitting diode OLED, or may emit, for example, red, green, blue, or white light from the organic light-emitting diode OLED.

The pixel electrode 21 may include a conductive oxide material such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 21 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the pixel electrode 21 may further include a film formed of ITO, IZO, ZnO, or $In_2O_3$ on/under the reflective film.

A pixel-defining film 19 having an opening 19OP exposing a central portion of the pixel electrode 21 may be disposed on the pixel electrode 21. The pixel-defining film 19 may include an organic insulation material and/or an inorganic insulation material. The opening 19OP may define an emission area EA of light emitted from the organic light-emitting diode OLED. For example, a width of the opening 19OP may correspond to a width of the emission area EA.

An emission layer 22 may be disposed on the opening 19OP of the pixel-defining film 19. The emission layer 22 may include a polymer or low-molecular weight organic material, which emits a predetermined color of light.

Although not shown, a first functional layer and a second functional layer may be disposed under the emission layer 22 and on the emission layer 22, respectively. The first functional layer may include, for example, a hole transport layer or may include, for example, the hole transport layer and a hole injection layer. The second functional layer is an element disposed on the emission layer 22 and is optional. The second functional layer may include an electron transport layer and/or an electron injection layer. The first functional layer and/or the second functional layer may be a common layer that is formed to entirely cover the substrate 10 as with a common electrode 23 which will be described below.

The common electrode 23 may include a conductive material with a low work function. For example, the common electrode 23 may include a transparent or semi-transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. As another example, on the transparent or semi-transparent layer including aforementioned material, the common electrode 23 may further include a layer including such as ITO, IZO, ZnO, or $In_2O_3$.

In an embodiment, the thin-film encapsulation layer TFE includes at least one inorganic encapsulation layer and at least one organic encapsulation layer. In an embodiment, the thin-film encapsulation layer TFE includes a first inorganic encapsulation layer 31, an organic encapsulation layer 32, and a second inorganic encapsulation layer 33, which are sequentially stacked, e.g., in this stated order as illustrated in FIG. 6.

The first inorganic encapsulation layer 31 and the second inorganic encapsulation layer 33 may include at least one inorganic material among aluminum oxide, titanium oxide, tantalum oxide, hafnium oxide, zinc oxide, silicon oxide, silicon nitride, and silicon oxynitride. The organic encapsulation layer 32 may include a polymer-based material. The polymer-based material may include acryl-based resin, epoxy-based resin, polyimide, polyethylene, or the like. In an embodiment, the organic encapsulation layer 32 may include acrylate.

In another embodiment, the thin-film encapsulation layer TFE may have a structure in which the substrate 10 and an upper substrate, which is a transparent member, are connected by a sealing member to seal an internal space between the substrate 10 and the upper substrate. A moisture absorbent, a filling material, or the like may be disposed in the internal space. The sealing member may be a sealant, and in another embodiment, the sealing member may be made of a material that is cured by laser. For example, the sealing member may be frit. The sealing member may include an organic sealant such as urethane-based resin, epoxy-based resin, or acryl-based resin, or an inorganic sealant such as silicone. The urethane-based resin may include, for example, urethane acrylate. The acryl-based resin may include, for example, butyl acrylate or ethylhexyl acrylate. The sealing member may be made of a material that is cured by heat.

A touch electrode layer (not shown) including touch electrodes may be disposed on the thin-film encapsulation layer TFE, and an optical functional layer (not shown) may be disposed on the touch electrode layer. The touch electrode layer may obtain coordinate information in response to an external input, for example, a touch event. The optical functional layer may reduce the reflectance of light (external light) incident on the display panel DP, and/or may improve the color purity of light emitted from the display panel DP. In an embodiment, the optical functional layer may include a retarder and a polarizer. The retarder may be a film type or a liquid crystal coating type and may include a λ/2 retarder and/or a λ/4 retarder. The polarizer may also be a film type or a liquid crystal coating type. The film type may include a stretch-type synthetic resin film, and the liquid crystal coating type may include liquid crystals arranged in a predetermined arrangement. The retarder and the polarizer may further include a protective film.

In another embodiment, the optical functional layer may include a black matrix and color filters. The color filters may be arranged considering color of light emitted from each of the pixels of the display panel DP. Each of the color filters may include a red, green, or blue pigment or a red, green, or blue dye. As another example, each of the color filters may further include a quantum dot, in addition to the pigment or the dye. As another example, some of the color filters may not include the pigment or the dye and may include scattering particles such as titanium oxide.

In another embodiment, the optical functional layer may include a destructive interference structure. The destructive interference structure may include a first reflective layer and a second reflective layer, which are disposed on different layers. First reflected light and second reflected light respectively reflected by the first reflective layer and the second reflective layer may destructively interfere with each other, and thus external light reflectance may be reduced.

An adhesive member may be between the touch electrode layer and the optical functional layer. The adhesive member may be any adhesive member generally known in the related art. The adhesive member may be a PSA.

In an embodiment, a flexible cover window may be disposed on the optical functional layer. The optical functional layer and the flexible cover window may be connected to each other by the adhesive member.

Figure 7:
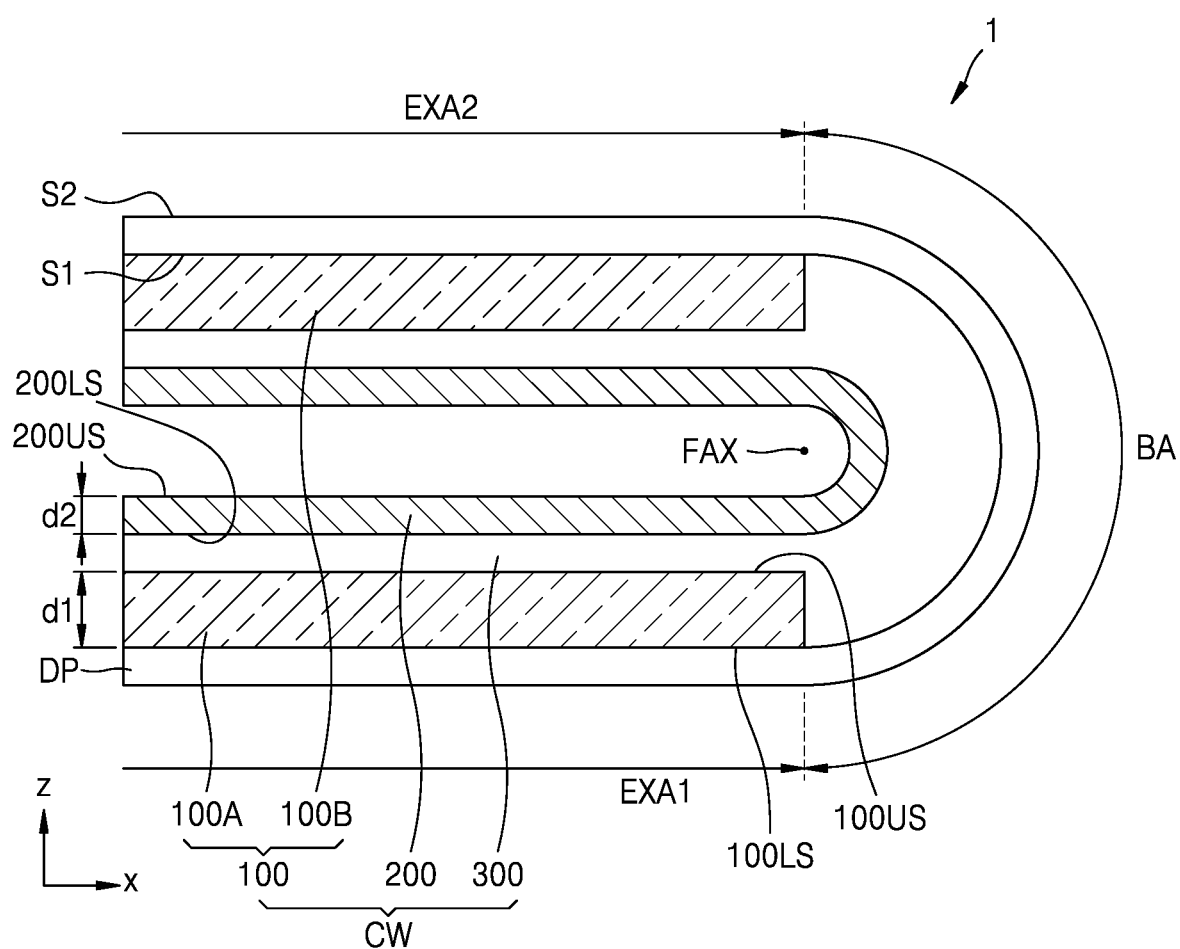
FIG. 7 and FIG. 8 are each a cross-sectional view of a state in which a foldable display apparatus is folded with respect to a folding axis, according to an embodiment.
Figure 8:
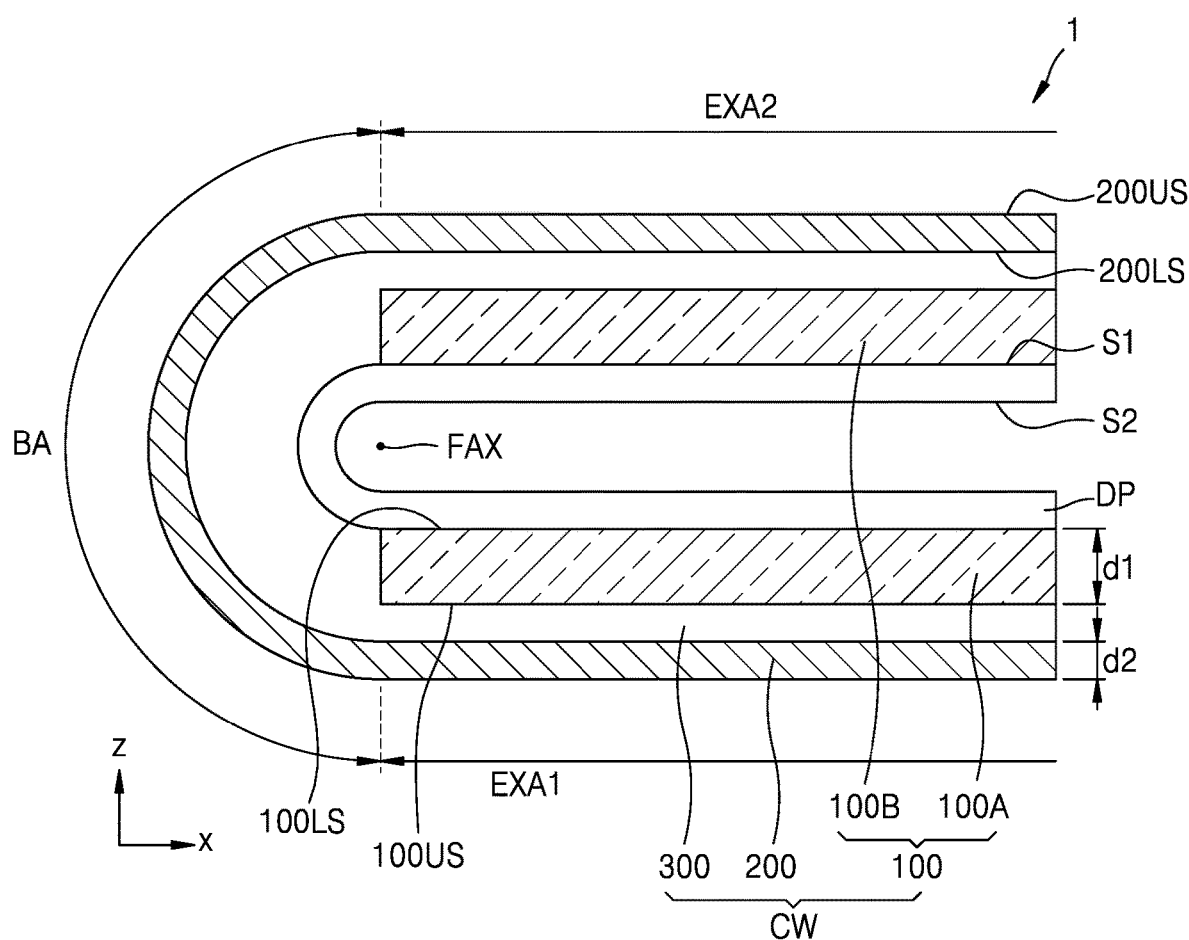

FIG. 7 and FIG. 8 are schematic cross-sectional views of a state in which the foldable display apparatus 1 is folded with respect to the folding axis FAX, according to an embodiment.

Referring to FIG. 7 and FIG. 8, the foldable display apparatus 1 may include the display panel DP including the display area and the flexible cover window CW covering the display panel DP. The flexible cover window CW may include the lower glass substrate 100, the upper glass substrate 200 that is disposed above the lower glass substrate 100 and is thinner than the lower glass substrate 100, and the adhesive member 300 between the lower glass substrate 100 and the upper glass substrate 200. The lower glass substrate 100 may include the first lower glass substrate 100A and the second lower glass substrate 100B spaced apart from each other, and the adhesive member 300 may extend between the first lower glass substrate 100A and the second lower glass substrate 100B. The foldable display apparatus 1 may be folded with respect to the folding axis FAX.

The flexible cover window CW may include the bending area BA corresponding to the folding axis FAX and the first extension area EXA1 and the second extension area EXA2 respectively connected to corresponding sides of the bending area BA. The first lower glass substrate 100A may be located in the first extension area EXA1. For example, the first lower glass substrate 100A may overlap the first extension area EXA1. The second lower glass substrate 100B may be located in the second extension area EXA2. For example, the second lower glass substrate 100B may overlap the second extension area EXA2.

In an embodiment, the first lower glass substrate 100A and the second lower glass substrate 100B, which are thicker than the upper glass substrate 200, may be located in the first extension area EXA1 and the second extension area EXA2, respectively. Accordingly, the flexibility of the flexible cover window CW may increase in the bending area BA. The first lower glass substrate 100A may overlap the upper glass substrate 200 in the first extension area EXA1, and the second lower glass substrate 100B may overlap the upper glass substrate 200 in the second extension area EXA2. Accordingly, the lower glass substrate 100 and the upper glass substrate 200 may protect the display panel DP in the first extension area EXA1 and the second extension area EXA2 from external impact. For example, the flexible cover window CW may maintain high strength in the first extension area EXA1 and the second extension area EXA2.

Referring to FIG. 7, the display panel DP may include a first surface S1 facing the flexible cover window CW and a second surface S2 opposite to the first surface S1. In this case, the foldable display apparatus 1 may be folded such that the first surface S1 of the display panel DP faces itself with respect to the folding axis FAX. For example, the foldable display apparatus 1 may be an in-folding type foldable display apparatus.

In this case, the foldable display apparatus 1 may be folded such that the upper surfaces 100US of the lower glass substrate 100 face each other with respect to the folding axis FAX. The foldable display apparatus 1 may be folded such that the upper surface of the first lower glass substrate 100A and the upper surface of the second lower glass substrate 100B face each other with respect to the folding axis FAX.

The foldable display apparatus 1 may be folded such that an upper surface 200U5 of the upper glass substrate 200 faces itself with respect to the folding axis FAX. The upper surface 100US of the lower glass substrate 100 may face the lower surface 200LS of the upper glass substrate 200, and the upper surface 200U5 of the upper glass substrate 200 may be opposite to the lower surface 200LS of the upper glass substrate 200.

Referring to FIG. 8, the display panel DP may include a first surface S1 facing the flexible cover window CW and a second surface S2 opposite to the first surface S1. In this case, the foldable display apparatus 1 may be folded such that the second surface S2 of the display panel DP faces itself with respect to the folding axis FAX. For example, the foldable display apparatus 1 may be an out-folding type foldable display apparatus.

In this case, the foldable display apparatus 1 may be folded such that lower surfaces 100LS of the lower glass substrate 100 face each other with respect to the folding axis FAX. The foldable display apparatus 1 may be folded such that the lower surface of the first lower glass substrate 100A and the lower surface of the second lower glass substrate 100B face each other with respect to the folding axis FAX. The foldable display apparatus 1 may be folded such that the lower surface 200LS of the upper glass substrate 200 faces itself with respect to the folding axis FAX.

The flexible cover window according to an embodiment as described above may have both flexibility and high strength.

A foldable display apparatus including the flexible cover window may have flexibility in a bending area corresponding to a folding axis, and because lower glass substrates, which are thicker than an upper glass substrate, are located corresponding to a first extension area and a second extension area, which extend from the bending area, the foldable display apparatus may maintain high strength.

It should be understood that embodiments described herein should be considered in a descriptive sense only and not for purposes of limitation. Descriptions of features or aspects within each embodiment should typically be considered as being available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A flexible cover window comprising:
   a lower glass substrate including:
   a first lower glass substrate; and
   a second lower glass substrate, the first lower glass substrate and the second lower glass substrate being spaced apart from each other;
   an upper glass substrate that is disposed above the lower glass substrate and is thinner than the lower glass substrate; and
   an adhesive member disposed between the lower glass substrate and the upper glass substrate and extending between the first lower glass substrate and the second lower glass substrate, wherein
   the first lower glass substrate comprises a plurality of first protrusion portions protruding toward the second lower glass substrate.

2. The flexible cover window of claim 1, wherein the adhesive member connects the first lower glass substrate, the second lower glass substrate, and the upper glass substrate to one another.

3. The flexible cover window of claim 1, wherein the flexible cover window comprises:
   a bending area;
   a first extension area; and
   a second extension area, the first extension area and the second extension area being respectively connected to corresponding sides of the bending area,
   the first lower glass substrate is located in the first extension area, and
   the second lower glass substrate is located in the second extension area.

4. The flexible cover window of claim 1, wherein the upper glass substrate comprises:
   a lower surface facing the lower glass substrate; and
   a side surface intersecting the lower surface, and
   the adhesive member extends from the lower surface of the upper glass substrate to cover the side surface of the upper glass substrate.

5. The flexible cover window of claim 1, wherein an end portion of the first lower glass substrate and an end portion of the second lower glass substrate, which face each other, each include at least two step shapes.

6. The flexible cover window of claim 1, wherein the second lower glass substrate comprises a plurality of second protrusion portions protruding toward the first lower glass substrate.

7. The flexible cover window of claim 6, wherein each of the plurality of first protrusion portions faces corresponding one of the plurality of second protrusion portions.

8. The flexible cover window of claim 6, wherein
the first lower glass substrate comprises a plurality of recesses, each of the plurality of recesses being disposed between two adjacent first protrusion portions of the plurality of first protrusion portions, and
each of the plurality of second protrusion portions faces corresponding one of the plurality of recesses.

9. The flexible cover window of claim 1, wherein a refractive index of the adhesive member is identical to a refractive index of at least one of the lower glass substrate and the upper glass substrate.

10. The flexible cover window of claim 1, wherein at least one of the lower glass substrate and the upper glass substrate includes an ultra-thin tempered glass.

11. A foldable display apparatus comprising:
a display panel including a display area; and
a flexible cover window covering the display panel, wherein
the flexible cover window comprises:
a lower glass substrate including:
a first lower glass substrate; and
a second lower glass substrate, the first lower glass substrate and the second lower glass substrate being spaced apart from each other;
an upper glass substrate that is disposed above the lower glass substrate and is thinner than the lower glass substrate; and
an adhesive member disposed between the lower glass substrate and the upper glass substrate and extending between the first lower glass substrate of the lower glass substrate and the second lower glass substrate of the lower glass substrate, and
the foldable display apparatus is folded with respect to a folding axis intersecting the display area, wherein
the first lower glass substrate comprises a plurality of first protrusion portions protruding toward the second lower glass substrate.

12. The foldable display apparatus of claim 11, wherein the adhesive member connects the first lower glass substrate, the second lower glass substrate, and the upper glass substrate to one another.

13. The foldable display apparatus of claim 11, wherein the flexible cover window comprises:
a bending area corresponding to the folding axis;
a first extension area; and
a second extension area, the first extension area and the second extension area being respectively connected to corresponding sides of the bending area,
the first lower glass substrate is located in the first extension area, and
the second lower glass substrate is located in the second extension area.

14. The foldable display apparatus of claim 11, wherein the upper glass substrate comprises:
a lower surface facing the lower glass substrate; and
a side surface intersecting the lower surface, and
the adhesive member extends from the lower surface of the upper glass substrate to cover the side surface of the upper glass substrate.

15. The foldable display apparatus of claim 11, wherein an end portion of the first lower glass substrate and an end portion of the second lower glass substrate, which face each other, each include at least two step shapes.

16. The foldable display apparatus of claim 11, wherein the second lower glass substrate comprises a plurality of second protrusion portions protruding toward the first lower glass substrate.

17. The foldable display apparatus of claim 11, wherein a refractive index of the adhesive member is identical to a refractive index of at least one of the lower glass substrate and the upper glass substrate.

18. The foldable display apparatus of claim 11, wherein at least one of the lower glass substrate and the upper glass substrate includes an ultra-thin tempered glass.

19. The foldable display apparatus of claim 11, wherein the display panel comprises:
a first surface facing the flexible cover window; and
a second surface opposite to the first surface, and
the foldable display apparatus is folded such that the first surface of the display panel faces itself with respect to the folding axis.

20. The foldable display apparatus of claim 11, wherein the display panel comprises:
a first surface facing the flexible cover window; and
a second surface opposite to the first surface, and
the foldable display apparatus is folded such that the second surface faces itself with respect to the folding axis.

* * * * *